(12) United States Patent
Toya et al.

(10) Patent No.: US 6,348,416 B1
(45) Date of Patent: Feb. 19, 2002

(54) CARRIER SUBSTRATE FOR PRODUCING SEMICONDUCTOR DEVICE

(75) Inventors: Hideki Toya; Mitsuyoshi Imai; Masaki Sakaguchi; Naoki Yamabe, all of Nagano; Mamoru Suwa, Kawasaki; Toshiyuki Motooka, Kawasaki; Hideharu Sakoda, Kawasaki; Muneharu Morioka, Kawasaki, all of (JP)

(73) Assignees: Shinko Electric Industries Co., Ltd, Nagano; Fujitsu Limited, Kawasaki, both of (JP)

( * ) Notice: Subject to any disclaimer, the term of this patent is extended or adjusted under 35 U.S.C. 154(b) by 0 days.

(21) Appl. No.: 09/455,374

(22) Filed: Dec. 6, 1999

(30) Foreign Application Priority Data

Dec. 24, 1998 (JP) ............................................. 10-367012

(51) Int. Cl.⁷ ...................... H01L 21/311; H01L 21/302
(52) U.S. Cl. ........................................ 438/694; 438/742
(58) Field of Search ................................ 257/730, 784, 257/786; 438/15, 25, 26, 51, 55, 64, 612, 613, 665, 694, 742

(56) References Cited

U.S. PATENT DOCUMENTS

| | | | |
|---|---|---|---|
| 5,138,428 A | * | 8/1992 | Hainz et al. ................. 257/730 |
| 5,545,589 A | * | 8/1996 | Tomura et al. .............. 438/119 |
| 5,742,098 A | * | 4/1998 | Brunner ....................... 257/730 |
| 5,834,365 A | * | 11/1998 | Ming-Tsung et al. ....... 438/612 |
| 6,072,239 A | * | 6/2000 | Yoneda et al. ............... 257/730 |
| 6,242,813 B1 | * | 6/2001 | Huang et al. ................ 257/784 |

FOREIGN PATENT DOCUMENTS

| | | | |
|---|---|---|---|
| EP | 0 773 584 | 5/1997 | |
| JP | 63-214450 | * 3/1990 | ....... H01L/21/3205 |
| JP | 02-154473 | * 6/1990 | ........... H01L/21/60 |
| JP | 04-288843 | * 10/1992 | ........... H01L/21/60 |
| JP | 04-192029 | * 2/1994 | ........... H01L/21/60 |
| JP | 9-162348 | 6/1997 | |
| JP | 10-116935 | 5/1998 | |

OTHER PUBLICATIONS

Patent Abstract of Japan, vol. 12, No. 385 (E668), Oct. 14, 1998 and JP 63 129635 A (Seiko Epson Corp), Jun. 2, 1988.

* cited by examiner

*Primary Examiner*—Long Pham
*Assistant Examiner*—William David Coleman
(74) *Attorney, Agent, or Firm*—Staas & Halsey LLP

(57) ABSTRACT

In order to improve adhesion between a plated film which functions as an external connection terminal of a semiconductor device and a surface of a resin protuberance and to improve reliability, a carrier substrate includes a metal substrate 12 which is shaped into a sheet form, to which a semiconductor chip is fixed, and which is removed before the semiconductor device is completed, a recess 16 formed at a position of the metal substrate 12 corresponding to the resin protuberance and having a rugged bottom surface 16*a* and/or a rugged side surface, and a plated film 14 formed on the inner surface of the recess 16.

9 Claims, 6 Drawing Sheets

CARRIER SUBSTRATE FOR PRODUCING SEMICONDUCTOR DEVICE

BACKGROUND OF THE INVENTION

1. Field of the Invention

This invention relates to a carrier substrate for producing a semiconductor device, a production process of the carrier substrate, a semiconductor device, and a production process of the semiconductor device. More particularly, this invention relates to a carrier substrate for producing appropriately a resin mold, to a lead-less surface package type semiconductor device, to a production process of the carrier substrate, to a semiconductor device, and to a production process of the semiconductor device.

2. Description of the Related Art

As the size of electronic appliances has been reduced and their integration density has become higher, in the field of semiconductor devices, the demand for the miniaturization of semiconductor chips per se and the reduction of a pitch of external connection terminals has become stronger so as to reduce the size of semiconductor devices and to increase their integration density.

As a structure for accomplishing a reduction in size of a resin mold type semiconductor device, Japanese Unexamined Patent Publication (Kokai) No. 9-162348 proposes a package structure of a lead-less surface package type.

As shown in FIG. 2(d) of the accompanying drawings, a semiconductor device utilizing this package structure includes a semiconductor chip 20, a resin package 22 for sealing the semiconductor chip 20, a resin protuberance 24 formed on the surface of the resin package 22 connected to a mother board in such a manner as to protrude from this surface, a plated film 14 applied to the outer surface of the resin protuberance 24 and a wire 30 for electrically connecting each electrode 28 of the semiconductor chip 20 to the plated film 14.

This semiconductor device is produced by utilizing a carrier substrate 50 for producing a semiconductor device, which substrate 50 includes a sheet-like metal substrate 12 which supports the plated film 14 and onto which the semiconductor chip 20 is mounted, as shown in FIG. 1(d).

First, a production process of the carrier substrate 50 will be explained with reference to FIGS. 1(a) to 1(d).

A resist 39 is first applied to both surfaces of the metal substrate 12. The resist on one surface 12a of the metal substrate 12 is then removed in the portion that corresponds to the resin protuberance 24 to form a resist pattern (FIG. 1(a)).

Next, the metal substrate 12 having the resist pattern formed thereon is immersed in an etchant solution, and etching is conducted until the portion of the metal substrate 12 that corresponds to the resin protuberance 24 is half-etched to form a recess 16 (FIG. 1(b)).

The resist pattern is left as such, and plating is applied so as to form the plated film 14 inside the recess 16 (FIG. 1(c)).

The resist is exfoliated to complete the carrier substrate 50 (FIG. 1(d)).

Next, a process of producing a semiconductor device utilizing the carrier substrate 50 so formed will be explained with reference to FIGS. 2(a) to 2(d).

The semiconductor chip 20 is fixed by applying an adhesive, for example, to one of the surfaces 12a of the carrier substrate 50 described above (FIG. 2(a)).

Each electrode 28 disposed on the semiconductor chip 20 and the plated film 14 formed on the metal substrate 12 of the carrier substrate 50 are electrically connected by a wire 30 through wire bonding (FIG. 2(b)).

A resin package 22 is formed by resin molding on the carrier substrate 50 in order to seal the semiconductor chip 20 and the connection portions by the wires 30 with resin (FIG. 2(c)).

The metal substrate 12 is removed by etching in such a fashion as to leave the plated film 14 of the carrier substrate 50 (FIG. 2(d)). In consequence, the plated film 14 is exposed to the outside of the package and functions as a connection surface of external connection terminals, and a semiconductor device having a structure capable of being connected to the mother board is completed. Incidentally, copper (Cu), for example, is used as the material of the metal substrate 12 so that etching can be conducted satisfactorily.

In the structure of the carrier substrate 50 according to the prior art described above, however, the plated film 14 that constitutes the external connection terminal adheres only to the resin that flows into the recess 16 along the shape of the recess 16 having a semi-spherical sectional shape. Therefore, adhering power is small, and the plated film 14 is likely to exfoliate from the surface of the resin protuberance 24 and invites the drop of reliability of the product.

Therefore, the problem that the reliability of the external connection terminal connected to the mother board of the semiconductor device cannot be improved remains unsolved.

SUMMARY OF THE INVENTION

It is therefore the object of the present invention to provide a carrier substrate that improves adhesion between a plated film that functions as an external connection terminal and the surface of a resin protuberance in a semiconductor device of a resin mold, lead-less surface package type and can improve reliability, a production process of the carrier substrate, a semiconductor device, and a production process of the semiconductor device.

To accomplish the object described above, the present invention provides a carrier substrate for use in the production of a semiconductor device including a semiconductor chip, a resin package sealing the semiconductor chip, a resin protuberance disposed on the surface of the resin package connected to a mother board, a plated film covering the surface of the resin protuberance and a wire electrically connecting an electrode of the semiconductor chip to the plated film, wherein the carrier substrate comprises a sheet-like metal substrate dissolvable by an etchant solution not dissolving the plated film, and suitable for fixing the semiconductor chip; a recess disposed at a position of the metal substrate corresponding to the resin protuberance, and having a bottom surface and/or side surface that are/is rugged; and a plated film covering continuously the bottom surface and the side surface of the recess, and having a surface shape corresponding to the surface shapes of the bottom surface and the side surface.

The present invention provides also a process of producing a carrier substrate for use in the production of a semiconductor device including a semiconductor chip, a resin package sealing the semiconductor chip, a resin protuberance disposed on the surface of the resin package connected to a mother board, a plated film covering the surface of the resin protuberance and a wire electrically connecting an electrode of the semiconductor chip to the plated film; the carrier substrate including a sheet-like metal substrate dissolvable by an etchant solution not dissolving the plated film, and suitable for fixing the semiconductor chip; a recess disposed at a position of the metal substrate corresponding to the resin protuberance, and having a bottom surface and/or side surface that are/is rugged; and a plated film for continuously covering the bottom surface and the side surface of the recess, and having a surface shape corresponding to surface shapes of the bottom surface and the side surface, the process comprising the steps of:

forming the etching resist layer on both surfaces of the metal substrate;

patterning the etching resist layer on one of the surfaces of the metal substrate to form a resist pattern having an opening at a position corresponding to the resin protuberance and a part of the etching resist layer remaining in an island-like shape inside the opening;

etching the metal substrate, causing etching to proceed non-uniformly inside the opening due to the presence of the island-like etching resist layer, and thereby forming a recess having a side surface and a rugged bottom surface at the position of the opening of the resist pattern; and forming a plated film covering continuously the side surface and the bottom surface of the recess, and having a surface shape corresponding to the surface shapes of the side surface and the bottom surface.

In a preferred embodiment of the process of the present invention, the step of patterning the etching resist layer includes a step of forming the opening having a rugged periphery, and the step of etching the metal substrate includes a step of forming a recess having a rugged side surface corresponding to the profile of the opening and the rugged bottom surface. According to this embodiment, the surface area of the side surface of the recess can be increased, and adhesion with the sealing resin material can be further improved.

Preferably, the island-like etching resist layer has a rectangular frame-like shape. According to this embodiment, suitable ruggedness can be provided to the bottom surface of the recess, its surface area can be increased, and adhesion with the sealing resin can be further improved.

The present invention provides further a process of producing a carrier substrate for use in the production of a semiconductor device including a semiconductor chip, a resin package sealing the semiconductor chip, a resin protuberance disposed on the surface of the resin package connected to a motherboard, a plated film covering the surface of the resin protuberance and a wire electrically connecting an electrode of the semiconductor chip to the plated film; the carrier substrate including a sheet-like metal substrate dissolvable by an etchant solution not dissolving the plated film, and suitable for fixing the semiconductor chip; a recess disposed at a position of the metal substrate corresponding to the resin protuberance, and having a bottom surface and/or side surface that are/is rugged; and a plated film covering continuously the bottom surface and the side surface of the recess, and having a surface shape corresponding to surface shapes of the bottom surface and the side surface, the process comprising the steps of:

forming an etching resist layer on both surfaces of the metal substrate;

patterning the etching resist layer on one of the surfaces of the metal substrate to form an opening having a rugged profile at a position corresponding to the resin protuberance;

etching the metal substrate to form a recess having a bottom surface and a rugged side surface corresponding to the profile of the opening at the position of the metal substrate corresponding to the opening of the resist pattern; and forming a plated film covering continuously the bottom surface and side surface of the recess, and having a surface shape corresponding to the surface shapes of the side surface and the bottom surface.

The present invention provides also a process of producing a semiconductor device including a semiconductor chip, a resin package sealing the semiconductor chip, a resin protuberance disposed on the surface of the resin package connected to a motherboard, a plated film covering the surface of the resin protuberance and a wire electrically connecting an electrode of the semiconductor chip to the plated film, the process comprising the steps of:

preparing a carrier substrate including a sheet-like metal substrate dissolvable by an etchant solution not dissolving the plated film, and suitable for fixing the semiconductor chip; a recess disposed at a position of the metal substrate corresponding to the resin protuberance, and having a bottom surface and/or side surface that are/is rugged; and a plated film covering continuously the bottom surface and the side surface of the recess, and having a surface shape corresponding to surface shapes of the bottom surface and the side surface;

fixing the semiconductor chip to the carrier substrate;

electrically connecting the electrode of the semiconductor chip to the plated film of the recess of the carrier substrate by a wire through wire bonding;

forming by resin molding a resin package for sealing the semiconductor chip and the wire on the carrier substrate, the resin package including the resin protuberance fitting to the recess of the metal substrate via the plated film and having a surface shape corresponding to the surface shape of the recess; and dissolving and removing the metal substrate while leaving the plated film covering the surface of the resin protuberance unremoved.

The present invention provides also a semiconductor device including a semiconductor chip, a resin package sealing the semiconductor chip, a resin protuberance disposed on the surface of the resin package connected to a motherboard, a plated film covering the surface of the resin protuberance and a wire electrically connecting an electrode of the semiconductor chip to the plated film, wherein the semiconductor device is produced by a process comprising the steps of:

preparing a carrier substrate including a sheet-like metal substrate dissolvable by an etchant solution not dissolving the plated film, and suitable for fixing the semiconductor chip; a recess disposed at a position of the metal substrate corresponding to the resin protuberance, and having a bottom surface and/or side surface that are/is rugged; and a plated film covering continuously the bottom surface and the side surface of the recess, and having a surface shape corresponding to the surface shapes of the bottom surface and the side surface;

fixing the semiconductor chip to the carrier substrate;

connecting electrically the electrode of the semiconductor chip to the plated film of the recess of the carrier substrate by a wire through wire bonding;

forming by resin molding a resin package for sealing the semiconductor chip and the wire on the carrier substrate, the resin package including the resin protuberance fitting to the recess of the metal substrate via the plated film, and having a surface shape corresponding to a surface shape of the recess; and dissolving and removing the metal substrate while leaving the plated film covering the surface of the resin protuberance unremoved.

DESCRIPTION OF THE PREFERRED EMBODIMENTS

Hereinafter, preferred embodiments of the present invention will be explained in detail with reference to the accompanying drawings.

Figure 3:
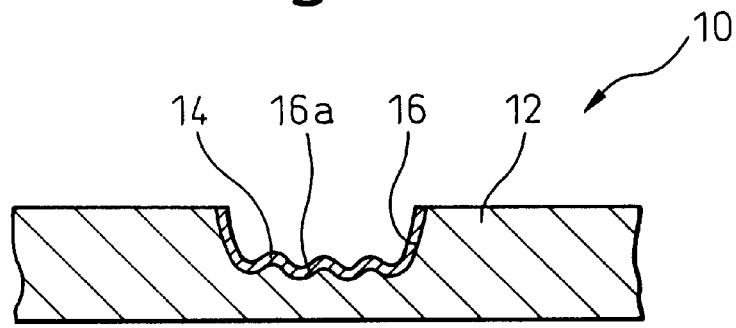
FIG. 3 is a sectional view showing a carrier substrate for a semiconductor device according to an embodiment of the present invention.
Figure 4A:
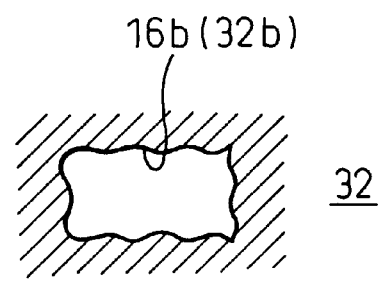
FIGS. 4(a) and 4(b) are a plan view (a) and a sectional view (b) showing a carrier substrate for a semiconductor device according to another embodiment of the present invention.
Figure 4B:
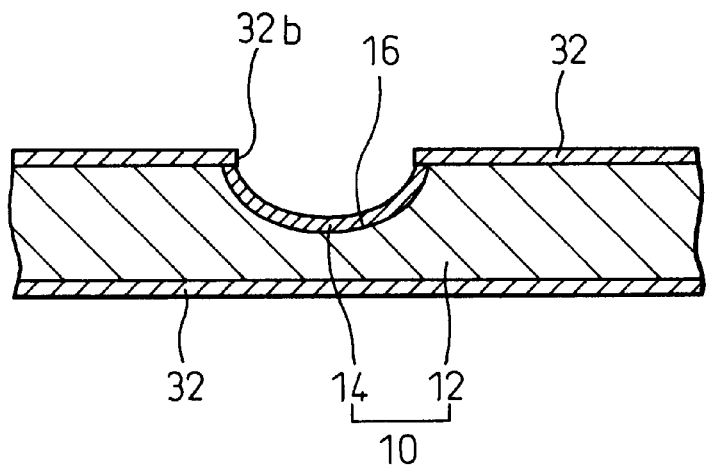

FIG. 3 is a sectional view showing a carrier substrate for a semiconductor device (hereinafter called merely the "carrier substrate") according to an embodiment of the present invention. FIGS. 4(a) and 4(b) are a plan view (a) and a sectional view (b) showing the carrier substrate according to another embodiment of the present invention.

Figure 1A:
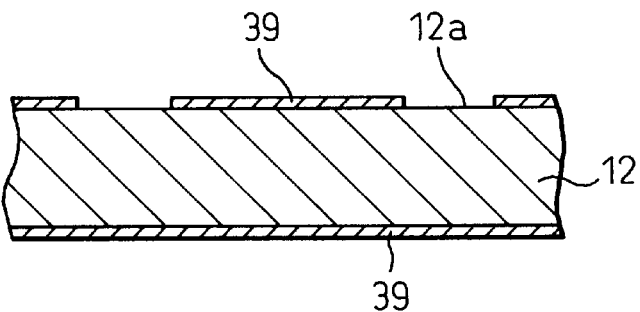
FIGS. 1(a) to 1(d) are sectional views showing a production process of a carrier substrate according to the prior art.
Figure 1B:
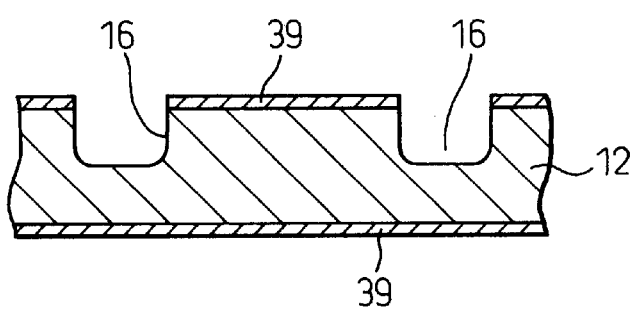
Figure 1C:
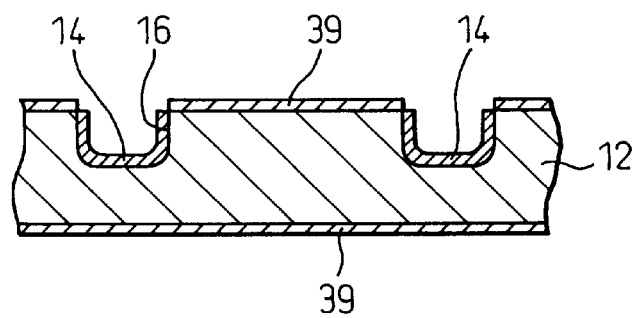
Figure 1D:
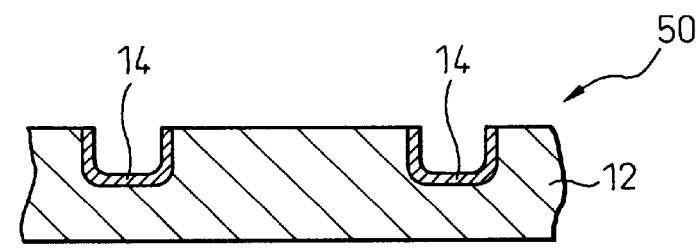
Figure 2A:
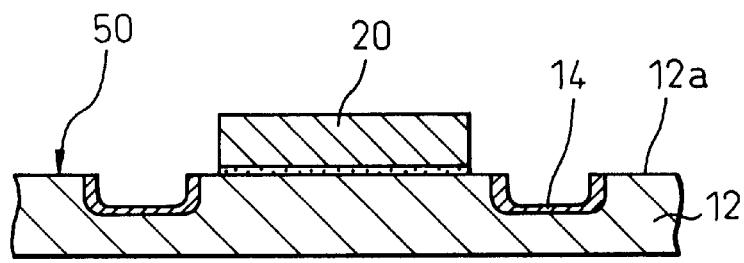
FIGS. 2(a) to 2(d) are sectional views showing a production process of a semiconductor device using the carrier substrate according to the prior art.
Figure 2B:
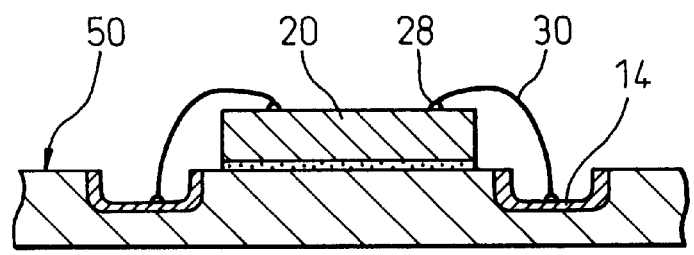
Figure 2C:
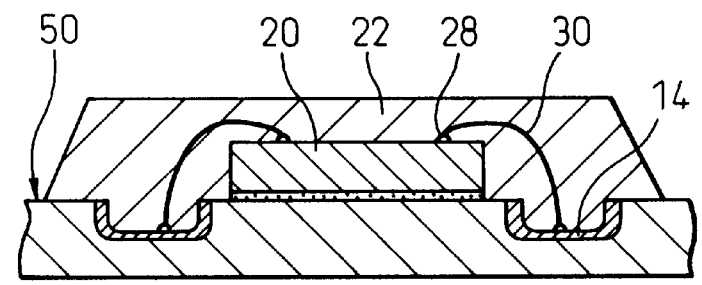
Figure 2D:
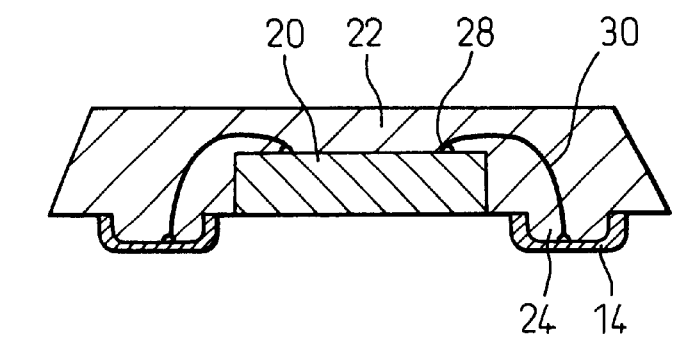

As shown in FIG. 3, a carrier substrate 10 according to one embodiment of the present invention includes a metal substrate 12 which is shaped into a sheet form, to which a semiconductor chip is fixed during the production process of the semiconductor device, and which is removed before the semiconductor device is completed, a recess 16 formed at the position of the metal substrate 12 that corresponds to the aforementioned resin protuberance 24 (see FIG. 2(d)) and has a rugged surface 16a therein and a plated film 14 formed on the inner surface of the recess 16.

As shown in FIGS. 4(a) and 4(b), the carrier substrate 10 according to another embodiment of the present invention includes a sheet-like metal substrate 12 to which a semiconductor chip is mounted during the fabrication process of the semiconductor device, a recess 16 formed at the position of the metal substrate 12 corresponding to the aforementioned resin protuberance (see FIG. 2(d)), and having a rugged inner surface 16b, and a plated film 14 formed on the inner surface of the recess 16.

A semiconductor device including a semiconductor chip 20, a resin package 22 sealing the semiconductor chip 20, a resin protuberance 24 provided on the surface of the resin package 22, which surface is to be connected to the motherboard, in such a fashion as to protrude from this surface, a plated film 14 disposed on the outer surface of the resin protuberance 24 and a wire 30 electrically connecting the electrode 28 of the semiconductor chip to the plated film 14, can be produced appropriately by using this carrier substrate 10.

In other words, in the semiconductor device according to the present invention, the plated film 14 is formed into a recessed shape so that its outer surface shape corresponds to the shape of the inner bottom surface and/or the inner side surface of the recess 16 of the metal substrate 12, and the inner surface of the plated film is shaped into the rugged shape corresponding to the outer surface of the plated film. The resin protuberance 24 is shaped into the rugged shape that profiles the inner surface of the plated film with the exception of the connecting portions of the wire 30.

Because the ruggedness is formed on the inner surface of the recess 16, the surface area of the inner surface of the recess 16 can be increased. Therefore, the surface area of the plated film 14, too, can be increased while profiling the ruggedness of the inner surface of the recess 16. In consequence, the surface area of the inner surface of the plated film 14 is increased, and the close contact area with the sealing resin material can be increased. Therefore, adhesion between them can be increased, exfoliation of the plated film 14 from the resin protuberance 24 can be prevented, and reliability of the semiconductor device can be improved.

Needless to say, a better effect can be obtained by forming the ruggedness on both of the bottom surface 16a and the side surface 16b in order to accomplish the constructions of both of the embodiment shown in FIG. 3 and embodiment shown in FIGS. 4(a) and 4(b).

Next, a production process of the carrier substrate according to one embodiment of the present invention will be explained step by step.

First, an etching resist 32 is applied in the layer form to both surfaces of the metal substrate 12 in a resist coating step. In the next resist pattern formation step, the etching resist 32 in the portion corresponding to the resin protuberance 24 on one of the surfaces of the metal substrate 12 is removed in such a fashion as to leave a part of the etching resist 32a inside the portion, thereby forming a resist pattern as shown in FIGS. 5(a) and 5(b).

Figure 5A:
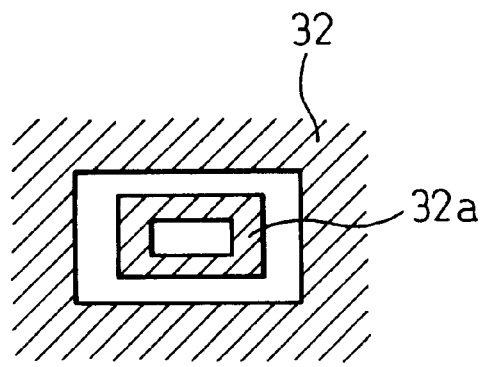
FIGS. 5(a) and 5(b) are a plan view (a) and a sectional view (b) showing a resist pattern formation process in the production process of the carrier substrate for the semiconductor device shown in FIG. 3.
Figure 5B:
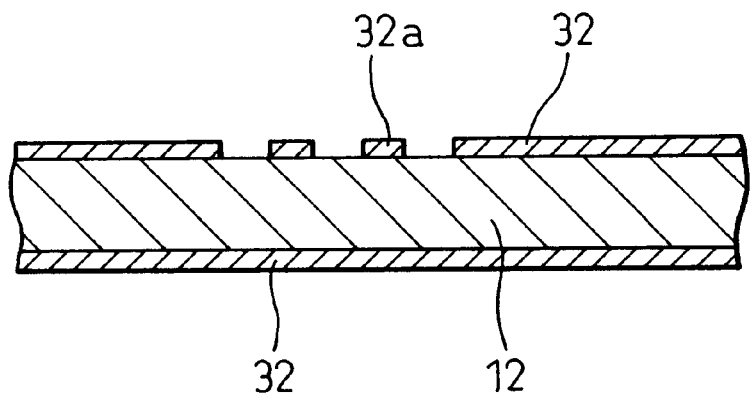

In this embodiment, the etching resist 32a left in the island shape inside the portion corresponding to the resist protuberance 24 is shaped into a rectangular frame shape (ring-like shape) as shown in FIG. 5(a). In consequence, the surface area can be increased by forming appropriately the ruggedness on the inner bottom surface 16a of the recess 16, and adhesion with the sealing resin material can be improved appropriately. Incidentally, the shape of the above-mentioned portion of the etching resist 32a is not limited to this shape, but can be formed selectively in various shapes, such as a simple square island shape, by designing the photomask in accordance with the shape of the resin protuberance 24 and its size.

Figure 6A:
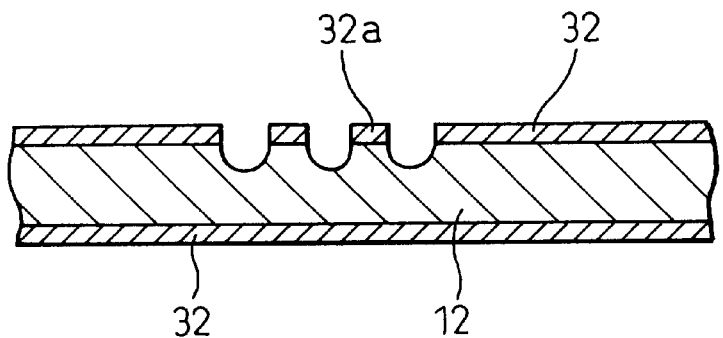
FIGS. 6(a) to 6(c) are sectional views showing an etching process in the production process of the carrier substrate for the semiconductor device shown in FIG. 3.
Figure 6B:
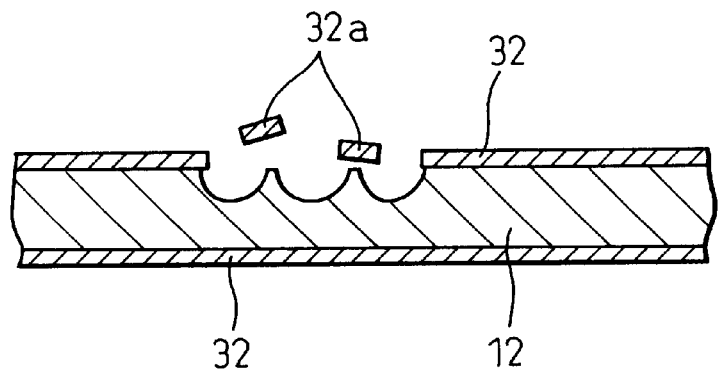
Figure 6C:
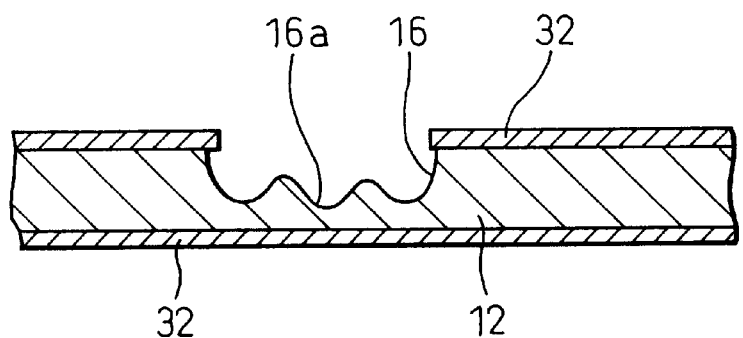

Next, the etching process is conducted as shown in FIGS. 6(a) to 6(c).

In the etching process of this embodiment, etching is conducted at the portion of the metal substrate 12 at which the resist pattern is formed so as to form a recess 16 having a rugged bottom surface 16a.

FIG. 6(a) shows the initial stage of the etching process at which the portion of the metal substrate 12 from which the etching resist 32 is removed, starts being dissolved.

When etching proceeds to a certain extent as shown in FIG. 6(b), the island-like etching resist 32a exfoliates naturally.

As etching proceeds further, the recess 16, whose bottom surface 16a has ruggedness, is formed appropriately as shown in FIG. 6(c).

Incidentally, this recess 16 must have a predetermined depth in order to suitably mount the semiconductor device on the substrate. Therefore, the recess 16 is formed into a depth of about 0.1 mm, for example.

Figure 7:
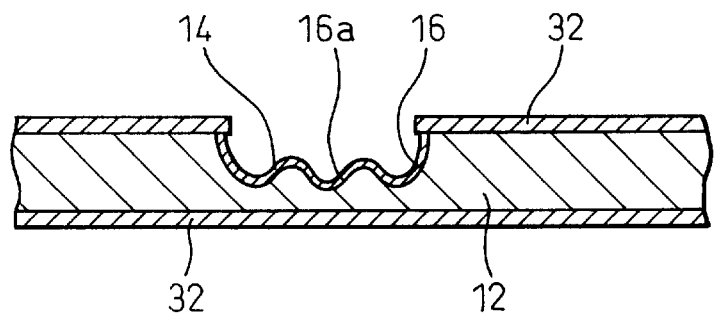
FIG. 7 is a sectional view showing a plating process in the production process of the carrier substrate for the semiconductor device shown in FIG. 3.

Next, a plating process for forming the plated film 14 on the inner surface of the recess 16 is carried out as shown in FIG. 7. In other words, while the resist pattern of the etching resist 32 is left as such, plating is carried out using the etching resist 32 as the plating resist so as to form the plated film 14 on the inner surface of the recess 16.

In this plating process, the plated layer may be formed by electrolytic plating.

The plating layer of this plated film 14 preferably comprises a four-layered plated layer of gold (Au), palladium (Pd), nickel (Ni) and palladium (Pd) in that order. When the plated film 14, comprising the four-layered plated layer, is transferred to the resin protuberance 24 of the semiconductor device, the gold plating layer as the lowermost layer of the recess 16 is exposed to provide a connection surface to an external connection terminal and can suitably combine with the solder, so that surface packaging to the circuit substrate can be executed appropriately. Since the palladium plating layer as the outermost layer of the recess 16 can suitably combine with the gold wire by wire bonding, if can be reliably connected electrically.

When the resist 32 is exfoliated, the carrier substrate 10 (see FIG. 3) is obtained.

Next, the production process of the carrier substrate according to another embodiment of the present invention will be explained with reference to FIGS. 4(a) and 4(b). Incidentally, an explanation will be omitted about the same step as the production process of the carrier substrate described above.

In order to fabricate the carrier substrate 10 shown in FIGS. 4(a) and 4(b), the etching resist 32 at the portion of one of the surfaces 12a of the metal substrate 12, that corresponds to the resin protuberance 24, is removed in the resist pattern formation process in such a fashion that the profile lines 32b, that define the portion, becomes rugged, forming the resist pattern.

In the etching process, the portion of the metal substrate 12 at which the resist pattern is formed is etched so that the recess 16 having the rugged side surfaces 16b is formed.

In consequence, the surface area of the plated film 14 so formed as to profile the side surfaces 16b of the recess 16 can be increased, and adhesion between the plated film 14 and the sealing resin material can be improved appropriately. Because the side surfaces 16b have the curved shape, the plated film 14 so formed as to profile the side surfaces is formed in the curved shape, too. Consequently, the sealing resin material can be bonded to the plated film 14 in multiple directions, and adhesion between them can be improved appropriately. Incidentally, the term "sealing resin material" represents the resin material for forming the resin package 22 shown in FIGS. 2(a) to 2(d).

The semiconductor device can be produced by serially conducting a chip fitting process (fixing of the semiconductor chip) for fitting the semiconductor chip 20 to the carrier substrate 10, a wire bonding process, a molding process (resin molding) and removing of the metal substrate 12 by etching, subsequent to the production process of the carrier substrate 10 described above, in the same way as the production process shown in FIGS. 2(a) to 2(d).

Figure 8A:
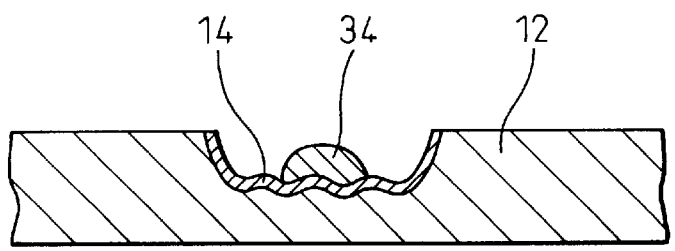
FIGS. 8(a) and 8(b) are sectional views showing a wire bonding process in the production process of the semiconductor device according to the present invention.
Figure 8B:
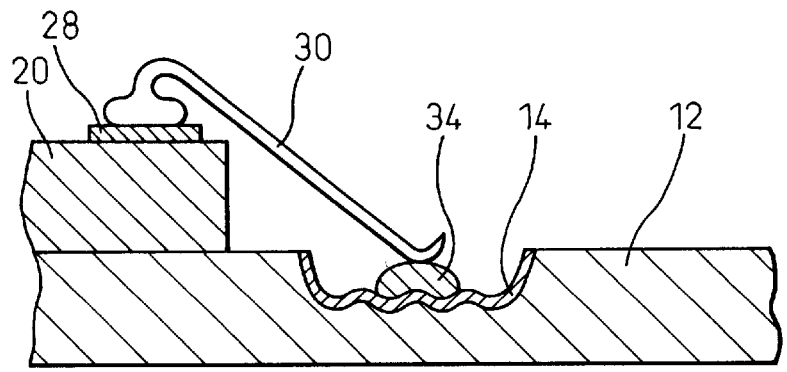

If reliability of wire bonding drops in the wiring bonding process, as ruggedness exists in the bonding area of the plated film 14, a gold ball 34 may be formed in advance so as to prepare for second bonding, as shown in FIGS. 8(a) and 8(b). In other words, as shown in FIG. 8(a), the gold ball 34 is formed in advance by ball-bonding on the plated film 14 that is formed on the inner surface of the recess 16. First bonding (ball-bonding) is carried out to the electrode 28 of the semiconductor chip 20 and then second bonding (wedge-bonding) is carried out to the gold ball 34. In this way, reliability of electrical connection by wire bonding can be secured.

Though the present invention has thus been described regarding the preferred embodiment thereof, the present invention is not particularly limited thereto, but can be naturally changed or modified in various ways without departing from the spirit and scope thereof.

According to the carrier substrate of the present invention, the bottom surface and/or the side surface of the recess is rugged to increase the surface area of the inner surface of the recess. In consequence, the inner surface of the plated film so formed as to profile the ruggedness of the inner surface of the recess becomes rugged to increase the surface area. Therefore, adhesion can be improved between the inner surface of the plated film and the sealing resin material, and exfoliation due to the resin protuberance can be prevented.

In the semiconductor device of the resin mold, leadless surface package type, therefore, the present invention can improve adhesion between the plated film functioning as the external connection terminal and the surface of the resin protuberance, and can remarkably improve reliability.

We claim:

1. A process in me production of a semiconductor device including a semiconductor chip, a resin package sealing said semiconductor chip, a resin protuberance on the surface of said resin package, a plated film covering the surface of said resin protuberance and a wire electrically connecting an electrode of said semiconductor chip to said plated film, said carrier substrate including a sheet-like metal substrate dissolvable by an etchant solution not dissolving said plated film, and suitable for fixing said semiconductor chip; a recess disposed at a position of said metal substrate corresponding to said resin protuberance, and having a bottom surface and/or side surface that are/is rugged; and a plated film for covering continuously said bottom surface and said side surface of said recess, and having a surface shape corresponding to surface shapes of said bottom surface and said side surface, said process comprising:

forming an etching resist layer on both surfaces of said sheet-like metal substrate;

patterning said etching resist layer on one of the surfaces of said metal substrate to form a resist pattern having an opening at a position corresponding to said resin protuberance such that a part of said etching resist layer remains in an island-like shape inside said opening;

etching said metal substrate, said island-like shape causing said etching to proceed non-uniformly inside said opening, thereby forming a recess having a side surface and a rugged bottom surface at the position of said opening of said resist pattern; and forming a plated film covering said side surface and said bottom surface of said recess.

2. A process of producing a carrier substrate according to claim 1, wherein said step of patterning said etching resist layer includes a step of forming said opening having a rugged periphery, and said step of etching said metal substrate includes a step of forming a recess having a rugged side surface corresponding to the profile of said opening and said rugged bottom surface.

3. A process of producing a carrier substrate according to claim 1, wherein said island-like etching resist layer has a rectangular frame-like shape.

4. A process in the production of a semiconductor device including a semiconductor chip, a resin package sealing said semiconductor chip, a resin protuberance on the surface of said resin package, a plated film covering the surface of said resin protuberance and a wire electrically connecting an electrode of said semiconductor chip to said plated film, said carrier substrate including a sheet-like metal substrate dissolvable by an etchant solution not dissolving said plated film, and suitable for fixing said semiconductor chip; a recess disposed at a position of said metal substrate corresponding to said resin protuberance, and having a bottom surface and/or side surface that are/is rugged; and a plated film covering continuously said bottom surface and said side surface of said recess, and having a surface shape corresponding to surface shapes of said bottom surface and said side surface, said process comprising:

forming an etching resist layer on both surfaces of said sheet like metal substrate;

patterning said etching resist layer on one of the surfaces of said metal substrate to form a non-uniform opening having a rugged profile at a position corresponding to said resin protuberance;

etching said metal substrate to form a recess having a bottom surface and a rugged side surface, caused by the non-uniform opening corresponding to the profile of said opening at the position of said metal substrate corresponding to said opening of said resist pattern; and forming a plated film covering said bottom surface and side surface of said recess.

5. A process in the production of a semiconductor device including a semiconductor chip, a resin package sealing said semiconductor chip, a resin protuberance on the surface of said resin package, a plated film covering the surface of said resin protuberance and a wire electrically connecting an electrode of said semiconductor chip to said plated film, said process comprising:

creating a carrier substrate including a sheet-like metal substrate dissolvable by an etchant solution not dissolving said plated film and suitable for fixing said semiconductor chip, a recess disposed at a position of said sheet-like metal substrate corresponding to said resin protuberance and having at least one of a bottom surface and side surface that is rugged because of a non-uniform opening, a plated film covering continuously said bottom surface and said side surface of said recess;

fixing said semiconductor chip to said carrier substrate;

connecting electrically said electrode of said semiconductor chip to said plated film of said recess of said carrier substrate by a wire through wire bonding;

forming by resin molding a resin package for sealing said semiconductor chip and said wire on said carrier substrate, the resin package including said resin protuberance fitting to said recess of said metal substrate via said plated film and having a surface shape corresponding to the surface shape of said recess; and dissolving and removing said metal substrate while leaving said plated film covering the surface of said resin protuberance.

6. A process of producing a carrier substrate according to claim 2, wherein said island-like etching resist layer has a rectangular frame-like shape.

7. A method in the production of a semiconductor device, comprising:

patterning an etching resist layer on one surface of a metal substrate to form a resist pattern having an opening at a position corresponding to a protuberance such that a part of the etching resist layer remains in an island-like shape inside the opening; and etching the metal substrate, such that the island-like shape causes the etching to proceed non-uniformly inside the opening, thereby forming a recess having at least one of a rugged side surface and a rugged bottom surface at the position of said opening of said resist pattern.

8. The method of claim 7, wherein the island like shape is at least one of rectangular, oval and triangular.

9. The method of claim 7, wherein the opening has an irregular edge, causing the rugged side surface.

* * * * *